United States Patent
Yaginuma et al.

[11] Patent Number: 5,445,873
[45] Date of Patent: Aug. 29, 1995

[54] ROOM TEMPERATURE CURABLE SOLVENTLESS SILICONE COATING COMPOSITIONS

[75] Inventors: Atsushi Yaginuma, Annaka, Japan; Nobuyuki Hasebe, Rancho Palos Verdes, Calif.; Tsuneo Kimura, Annaka; Masatoshi Arai, Annaka, all of Japan

[73] Assignee: Shin-Etsu Chemical Co., Ltd., Tokyo, Japan

[21] Appl. No.: 274,380

[22] Filed: Jul. 13, 1994

Related U.S. Application Data

[63] Continuation of Ser. No. 143,956, Nov. 1, 1993, abandoned.

[51] Int. Cl.$^6$ ............................................. B32B 33/00
[52] U.S. Cl. ...................................... 428/220; 427/96; 428/335; 428/336
[58] Field of Search ................. 428/220, 335, 336, 76

[56] References Cited

U.S. PATENT DOCUMENTS

| | | | |
|---|---|---|---|
| 4,180,642 | 12/1979 | Takago | 528/32 |
| 4,460,740 | 7/1984 | Arai | 524/724 |
| 5,130,401 | 7/1992 | Arai et al. | 528/33 |
| 5,196,477 | 3/1993 | Arai et al. | 524/863 |

*Primary Examiner*—Melvyn I. Marquis
*Attorney, Agent, or Firm*—Millen, White, Zelano & Branigan

[57] ABSTRACT

A room temperature curable solventless silicone coating composition includes (A) an organopolysiloxane end-blocked with a hydroxyl radical, (B) a tri- or tetra-hydrocarbonoxysilane or a partial hydrolyzate thereof, and (C) a curing catalyst in the form of an organic carboxylate of a heavy metal, an organic titanate ester, a guanidyl-substituted alkoxysilane, or an organic compound having a guanidyl radical containing a siloxane. When it has a viscosity of 20 to 500 centipoise at 25° C., it is easily applicable by conventional coating techniques such as dipping and spraying, and quickly cures at room temperature into uniform coatings, suitable for covering circuit boards.

15 Claims, No Drawings

ROOM TEMPERATURE CURABLE SOLVENTLESS SILICONE COATING COMPOSITIONS

This application is a continuation of application Ser. No. 08/143,956, filed Nov. 1, 1993, abandoned.

BACKGROUND OF THE INVENTION

1. Field of the Invention

This invention relates to a room temperature curable solventless silicone coating composition suitable for use in coating and protecting packaged circuit boards having electric and electronic chips mounted thereon, and a method of protecting the packaged circuit boards from a severe ambient environment.

2. Prior Art

Packaged circuit boards having electric and electronic elements mounted thereon are widely used as electric parts in automobiles, aircraft and the like. It is a common practice to cover such circuit boards or electric and electronic elements with coating compositions based on a resin or high viscosity oil for the purposes of maintaining electrical insulation and protecting the circuit boards from a severe ambient environment where they encounter high temperature, high humidity, water immersion and dust.

The coating compositions as such are difficult to apply because of high viscosity. For the purpose of improving working efficiency and production yield, they are generally diluted with organic solvents such as toluene, xylene and hexane to a sufficient viscosity to enable dipping, flow coating, brush coating or spraying. The diluted compositions are applied to circuit board surfaces and the organic solvents are evaporated off at elevated temperatures or room temperature. The compositions are then cured by heating or irradiating with ultraviolet radiation, thereby forming coatings.

Most of the solvents used are released in the air without recovery, causing environmental pollution and adversely affecting the health of workers. Attempts have been made to recover evaporating solvents without releasing them in the air, but at the sacrifice of economy because an increased capital investment is needed.

As to performance, the conventional coating compositions also have problems. Since cured coatings are very hard, stresses which are induced by thermal expansion and contraction in accordance with ambient temperature changes can be directly transmitted to electronic elements on the circuit board surface, causing a failure of electronic elements. The problem becomes more serious with the recent trend requiring further size reduction of electronic elements.

Addressing the environmental problem, legislation restricting the use of solvents was enacted in many states of the U.S.A. from the late 1980s. Also for protecting the atmosphere of working places from a hygienic aspect, there is a need to have coating compositions of the solventless type.

There are now available several coating compositions which meet these requirements. Developed were coating silicone compositions of the addition reaction type (using platinum catalysts) and UV curing reaction type which need not be diluted with solvents. The silicone compositions of the addition reaction type, however, have the problem that the platinum catalyst can be poisoned by some special materials of which parts mounted on the circuit board surface are made, restraining the compositions from curing. Thus, the compositions are limited in application. The silicone compositions of the UV curing reaction type have the problem that dark zones which cannot receive UV radiation do not cure. Thus, these compositions are inadequate for coating circuit boards having mounted parts of complex profile.

Also room temperature curable silicone coating compositions of the condensation reaction type are now commercially available. They have a viscosity of more than 500 centipoise at 25°. Because of the high viscosity, conventional coating techniques such as dipping, flow coating, brush coating and spraying cannot be employed in coating circuit boards with these coating compositions.

SUMMARY OF THE INVENTION

Therefore, an object of the present invention is to provide a solventless silicone coating composition which is easily applicable by conventional coating techniques such as dipping, flow coating, brush coating and spraying without diluting it with solvents, and which quickly cures at room temperature into a uniform coating. Another object is to provide a method of protecting a packaged circuit board from a severe ambient environment.

According to the present invention, there is provided a room temperature curable solventless silicone coating composition comprising the following components (A), (B) and (C). Component (A) is an organopolysiloxane end-blocked with a hydroxyl radical. Component (B) is a silane of the general formula (1):

wherein $R^1$ is a substituted or unsubstituted monovalent hydrocarbon radical, R2 is a substituted or unsubstituted monovalent hydrocarbon radical or an α, β-substituted vinyl radical, and letter m is equal to 3 or 4, or a partial hydrolyzate thereof. Component (C) is at least one curing catalyst selected from the group consisting of an organic carboxylate of a heavy metal, an organic titanate ester, a guanidyl-substituted alkoxysilane, and an organic compound having a guanidyl radical containing a siloxane. The composition should have a viscosity of 20 to 500 centipoise at 25° C. This composition is easily applicable directly by conventional coating techniques such as dipping, flow coating, brush coating and spraying. Due to the eliminated use of solvents, it is not detrimental to the health of workers and does not adversely affect the environment since no solvents are released. It quickly cures with moisture in air at room temperature without releasing any toxic or corrosive gas, that is without causing damages to parts mounted on the circuit board surface. It adheres well to circuit boards. It is thus suitable in conformal coating applications, for example, as a coating composition for coating circuit boards.

Conventional room temperature curable silicone coating compositions of the condensation reaction type are low in reactivity with curing agents. Particularly when low molecular weight organopolysiloxane end-blocked with a hydroxyl radical is used as a base, there results short curing. Thus high molecular weight organopolysiloxane end-blocked with a hydroxyl radical is often used. It was thus believed impossible to formulate as a conformal coating composition a silicone composition of the condensation reaction type which has a sufficiently low viscosity to apply to a substrate by conventional coating techniques such as dipping, flow coating, brush coating and spraying without a need for solvent. Nevertheless, we noticed that coatings having a thickness of less than 10 mil, especially less than 5 mil are suitable for covering circuit boards and this type of application does not always require cured products having relatively high physical strength (tensile strength, elongation and tear strength) as required in other industrial applications, for example, building materials, adhesives and electric and electric part encapsulating materials. We also noticed that a room temperature curable silicone composition of the condensation reaction type which will cure within 20 minutes and has a viscosity of up to 500 centipoise is preferred from working and productivity aspects.

Therefore, the present invention provides a room temperature curable solventless silicone coating composition comprising (A) an organopolysiloxane end-blocked with a hydroxyl radical, (B) a silane of the general formula (1):

$(R^2O)_m SiR_{4-m}^1$  (1)

wherein $R^1$ is a substituted or unsubstituted monovalent hydrocarbon radical, $R^2$ is a substituted or unsubstituted monovalent hydrocarbon radical or an $\alpha, \beta$-substituted vinyl radical, and letter m is equal to 3 or 4, or a partial hydrolyzate thereof, and (C) at least one curing catalyst selected from the group consisting of an organic carboxylate of a heavy metal, an organic titanate ester, a guanidyl-substituted alkoxysilane, and an organic compound having a guanidyl radical containing a siloxane, said composition having a viscosity of 20 to 500 centipoise at 25° C.

The present invention also provides a method of protecting a packaged circuit board having electric and electronic chips mounted thereon from a severe ambient environment comprising coating a room temperature curable solventless silicone coating composition on the packaged circuit board in a thickness of 1 to 5 mils, and curing the coated layers with the aid of moisture in air, said coating compositions comprising (A) an organopolysiloxane end-blocked with a hydroxyl radical, (B) a silane of the general formula (1):

$(R^2O)_m SiR_{4-m}^1$  (1)

wherein $R^1$ is a substituted or unsubstituted monovalent hydrocarbon radical, $R^2$ is a substituted or unsubstituted monovalent hydrocarbon radical or an $\alpha, \beta$-substituted vinyl radical, and letter m is equal to 3 or 4, or a partial hydrolyzate thereof, and (C) at least one curing catalyst selected from the group consisting of an organic carboxylate of a heavy metal, an organic titanate ester, a guanidyl-substituted alkoxysilane, and an organic compound having a guanidyl radical containing a siloxane, said composition having a viscosity of 20 to 500 centipoise at 25° C.

DETAILED DESCRIPTION OF THE INVENTION

As defined above, the room temperature curable solventless silicone coating composition of the invention includes essential components (A), (B), and (C).

Component (A) is an organopolysiloxane end-blocked with a hydroxyl radical, for example, one represented by the general formula (2):

$R_a^3 SiO_{(4-a)/2}$  (2)

wherein $R^3$ is a substituted or unsubstituted monovalent hydrocarbon radical having 1 to 12 carbon atoms, and letter a is a positive number of 1.9 to 2.05, and end-blocked with a hydroxyl radical. In this case, the organopolysiloxane in which the both ends are blocked with a hydroxy group is preferred. The end group is

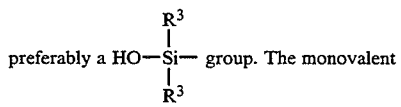

preferably a $HO-\underset{\underset{R^3}{|}}{\overset{\overset{R^3}{|}}{Si}}-$ group. The monovalent hydrocarbon radicals represented by $R^3$ include alkyl radicals such as methyl, ethyl, propyl, isopropyl, butyl, 2-ethylbutyl, and octyl radicals; cycloalkyl radicals such as cyclohexyl radicals; alkenyl radicals such as vinyl and hexenyl radicals; substituted or unsubstituted aryl radicals such as phenyl, tolyl, xylyl, naphthyl, xenyl and phenansil radicals; and substituted ones thereof wherein some or all of the hydrogen atoms are replaced by halogen atoms, cyano radicals or the like, for example, halogenated hydrocarbon radicals such as trifluoropropyl, trichloropropyl, bromophenyl and chlorocyclohexyl radicals and cyano hydrocarbon radicals such as cyanoethyl, cyanopropyl and cyanobutyl radicals.

Organopolysiloxanes (A) may be used alone or in admixture of two or more, although mixtures of one organopolysiloxane having a viscosity of at least 500 centipoise (cps) at 25° C., especially 500 to 5000 cps at 25° C. and another organopolysiloxane having a viscosity of up to 100 cps at 25° C., especially 5 to 100 cps at 25° C. are preferred. Better results are obtained when the former and the latter organopolysiloxanes are used in a weight ratio between 10:90 and 90:10. In these mixtures, if the former organopolysiloxane has a viscosity in excess of 5000 cps, some of the resulting silicone compositions cannot have a viscosity of 20 to 500 cps. If the latter organopolysiloxane has a viscosity of less than 5 cps, there must be blended more amounts of curing agent (B) to be described later in detail, resulting in more condensation products, which necessitates dilution with solvents prior to coating on substrates. The use of solvents results in cured coatings having an increased shrinkage factor and thus adversely affects parts mounted on circuit board surfaces. In addition, the resulting elastomers have increased modulus which also causes adverse affects to parts mounted on circuit board surfaces.

Component (B) is a silane of the following general formula (1) or a partial hydrolyzate thereof.

$(R^2O)_m SiR_{4-m}^1$  (1)

In formula (1), $R^1$ is a substituted or unsubstituted monovalent hydrocarbon radical, $R^2$ is a substituted or unsubstituted monovalent hydrocarbon radial or an $\alpha, \beta$-substituted vinyl radical, and letter m is equal to 3 or 4. Examples of the substituted or unsubstituted monovalent hydrocarbon radical represented by $R^1$ and $R^2$ are as previously defined for $R^3$. The silanes having an α,β-substituted vinyloxy radical include those of the following formula.

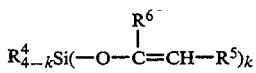

$$R^4_{4-k}Si(-O-C=CH-R^5)_k$$

In the formula, $R^4$ is a substituted or unsubstituted monovalent hydrocarbon radical, $R^5$ and $R^6$ are independently a hydrogen atom or a substituted or unsubstituted monovalent hydrocarbon radical, and letter k is equal to 3 or 4. Examples of the monovalent hydrocarbon radical represented by $R^4$, $R^5$ and $R^6$ are as previously described for $R^3$.

Illustrative, non-limiting examples of the silane (B) include methyltrimethoxysilane, vinyltrimethoxysilane, phenyltrimethoxysilane, propyltrimethoxysilane, tetramethoxysilane, methyltriethoxysilane, vinyltriethoxysilane, phenyltriethoxysilane, propyltriethoxysilane, tetraethoxysilane, methyltripropanoxysilane, vinyltripropanoxysilane, phenyltripropanoxysilane, propyltripropanoxysilane, tetrapropanoxysilane, methyltriisopropenyloxysilane, vinyltriisopropenyloxysilane, phenyltriisopropenyloxysilane, propyltriisopropenyloxysilane, tetraisopropenyloxysilane, and partial hydrolyzates thereof.

Component (B) is preferably blended in amounts of about 5 to 30 parts by weight per 100 parts by weight of component (A). With less than 5 component (B) on this basis, there is a likelihood that during its preparation or storage, the composition will thicken and gel, failing to provide an elastomer having desired physical properties. With an excess of 30 parts of component (B), creases would generate on the surface upon curing, failing to provide an elastomer having desired physical properties.

Component (C) is a curing catalyst selected from the group consisting of an organic carboxylate of a heavy metal, an organic titanate ester, a guanidyl-substituted alkoxysilane, and an organic compound having a guanidyl radical containing a siloxane. It is an agent for promoting curing. Exemplary catalysts are heavy metal salts such as dibutyltin diacetate, dibutyltin dilaurate, dibutyltin dioctylate, lead 2-ethyloctate, tin butyrate, and zinc stearate; organic titanate esters such as tetrabutyl titanate, tetra-2-ethylhexyl titanate, tetraphenyl titanate, and tetraoctadecyl titanate; organic titanium compounds such as organosiloxytitanium; guanidyl-substituted alkoxysilanes such as 1,1,3,3-tetramethylguanidine, 3-tetramethylguanidylpropyltrimethoxysilane, 3-tetramethylguanidylpropyltrimethylsilane, tetramethylguanidylmethyltrimethoxysilane, and tetramethylguanidylmethyltrimethylsilane; and organic compounds having a guanidyl radical containing a siloxane. These compounds may be used alone or in admixture of two or more.

Component (C) is preferably blended in amounts of about 0.01 to 10 parts by weight, more preferably 0.1 to 2 parts by weight per 100 parts by weight of component (A). With less than 0.01 parts of component (C) on this basis, curing necessitates a long time which is disadvantageous in operation efficiency. In excess of 10 parts of component (C), the resulting silicone composition would be increased in viscosity during its preparation and thus less stable during storage.

If desired, the composition of the invention may contain any of well-known additives, for example, various siloxane oils, fillers such as finely divided silica and precipitated silica, adhesive aids, pigments, dyes, antioxidants, anti-aging agents, antistatic agents, flame retardants, and heat transfer modifiers insofar as the objects of the invention are not impaired.

The composition of the invention is generally prepared by uniformly mixing components (A) to (C) and optional additives in a dry air or nitrogen atmosphere.

Another important feature of the invention is that the composition has a viscosity of 20 to 500 cps at 25° C., preferably 40 to 300 cps. Silicone compositions having a viscosity in excess of 500 cps not only tend to give rise to a tailing phenomenon in a dip coating process when circuit boards are pulled out of the liquid, that is the liquid does not instantaneously stop dripping, but also form relatively thick coatings. The tailing leads to a loss of liquid and causes contamination in a subsequent step. Such high viscosity compositions also encounter a problem in a flow coating process that since the high viscosity compositions flow slowly, it is difficult to selectively form cured coatings only at selected sites and in the worst case, masking is necessary. Silicone compositions having a viscosity of less than 20 cps suffer from a shrinkage problem due to increased contents of condensation products, difficulty to mitigate stresses due to the high modulus, slower curing, and thicker coatings. In addition, cured coatings are low in physical strength, that is, brittle.

Any of the conventional coating techniques may be used for coating the composition to circuit boards or other substrates. Exemplary coating techniques include dip coating in a nitrogen atmosphere, flow coating using an automatic discharging machine, spraying and brush coating. The resultant coatings are generally 1 to 5 mil thick, quickly cure with the aid of moisture in air after application, and firmly adhere to circuit boards or other substrates.

There has been described a solventless silicone coating composition which is easily applicable by conventional coating techniques such as dipping, flow coating, brush coating and spraying and which quickly cures at room temperature. The composition is best suited for coating of circuit boards.

EXAMPLE

Examples of the present invention are given below by way of illustration and not by way of limitation. All parts are by weight. The viscosity is a measurement in centipoise (cps) at 25° C.

EXAMPLE 1

A silicone composition having a viscosity of 270 cps was prepared by mixing 80 parts of a hydroxyl end-blocked dimethylpolysiloxane having a viscosity of 700 cps, 20 parts of a hydroxyl end-blocked dimethylpolysiloxane having a viscosity of 30 cps, 10 parts of vinyltri(isopropenyloxy)silane, 1 part of 3-aminopropyltriethoxysilane, and 1 part of 3-tetramethylguanidylpropyltrimethoxysilane in a dry state, followed by deaeration. A specimen of 20 mm×20 mm×2 mm was molded from the composition and allowed to stand for 7 days in air at 20° C. and RH 55% for curing.

EXAMPLE 2

A silicone composition having a viscosity of 60 cps was prepared by mixing 35 parts of a hydroxyl end-blocked dimethylpolysiloxane having a viscosity of 700 cps, 65 parts of a hydroxyl end-blocked dimethylpolysiloxane having a viscosity of 30 cps, 20 parts of dimethylpolysiloxane having a viscosity of 30 cps, 20 parts of vinyltri(isopropenyloxy)silane, 1 part of 3- aminopropyltriethoxysilane, and 1 part of 3- tetramethylguanidylpropyltrimethoxysilane in a dry state, followed by deaeration. A specimen of the composition was molded and cured as in Example 1.

COMPARATIVE EXAMPLE 1

A silicone composition having a viscosity of 600 cps was prepared by mixing 100 parts of a hydroxyl endblocked dimethylpolysiloxane having a viscosity of 700 cps, 8 parts of vinyltri(isopropenyloxy)silane, 1 part of 30 aminopropyltriethoxysilane, and 1 part of 3-tetramethylguanidylpropyltrimethoxysilane in a dry state, followed by deaeration. A specimen of the composition was molded and cured as in Example 1.

COMPARATIVE EXAMPLE 2

A silicone composition having a viscosity of 10 cps was prepared by mixing 100 parts of a hydroxyl endblocked dimethylpolysiloxane having a viscosity of 30 cps, 30 parts of vinyltri(isopropenyloxy)silane, 1 part of 3-aminopropyltriethoxysilane, and 1 part of 3-tetramethylguanidylpropyltrimethoxysilane in a dry state, followed by deaeration. A specimen of the composition was molded and cured as in Example 1.

The silicone compositions and cured specimens of these examples were examined for physical properties by the following tests.

Elongation of cured products
  measured in accordance with JIS K-6301 (dumbbell No. 2).
Tensile strength
  measured in accordance with JIS K-6301 (dumbbell No. 29).
Shear adhesive force
  measured in accordance with JIS K-6850. The aluminum plate used was 0.5 mm thick and the adhesive was 2 mm thick.
Volume resistance
  measured in accordance with JIS C-2123.

The results are shown in Table 1.

TABLE 1

| | Example | | Comparative Example | |
|---|---|---|---|---|
| | 1 | 2 | 1 | 2 |
| Composition | | | | |
| Viscosity (cps) | 270 | 60 | 600 | 10 |
| Tack - free time | 5 | 5 | 5 | 7 |
| Specific gravity @ 25° C. | 0.99 | 0.99 | 0.99 | 0.99 |
| Cured product | | | | |
| Hardness (JIS A - scale) | 34 | 30 | 30 | 42 |
| Elongation (%) | 80 | 40 | 120 | 10 |
| Tensile strength (kgf/cm$^2$) | 7 | 3 | 10 | 2 |
| Shear adhesive force (kgf/cm$^2$) | 2 | 2 | 3 | 2 |
| Volume resistance (Ω cm) | 6 × 10$^{15}$ | 6 × 10$^{15}$ | 6 × 10$^{15}$ | 6 × 10$^{15}$ |

The following experiments were done on the compositions of Examples 1-2 and Comparative Example 1.

Experiment 1

Using an automatic discharging machine (SELECT COAT APPLICATION SYSTEM, manufactured by NORDSON Corporation), each silicone composition was coated onto a circuit board surface to a thickness of 1 to 5 mil under conditions: a ⅜ inch pattern, a nozzle-to-board distance of 2/5 to ¾ inches, and a nozzle feed speed of 15 to 18 inches/sec. and then cured at room temperature.

The silicone compositions of Examples 1 and 2 cured within 8 minutes at 20° C. and RH 70% and within 5 minutes at 30° C. and RH 75% into uniform silicone coatings having a thickness of 1 to 5 mil. Cured coatings could be formed only at desired areas without a need for mask. In contrast, the silicone composition of Comparative Example 1 cured into a coating having varying thickness.

Experiment 2

A dip coating machine (manufactured by PAINT LINE Corporation) was used. The dip coating tank was charged with each silicone composition, and a nitrogen atmosphere was established above the surface thereof. Circuit boards were dipped in the composition and pulled up at a rate of 6 inches/min. The silicone composition was coated to a thickness of 1 to 5 mil in this way and cured at room temperature.

The silicone compositions of Examples 1 and 2 cured to the circuit board surface within 10 minutes at 23° C. and RH 65% to form uniform silicone coatings having a thickness of 1 to 5 mil. When the boards were pulled up from the dipping tank, the liquid (silicone composition) instantaneously stopped dripping, giving rise to no tailing and causing no inconvenience in subsequent steps or over the entire process.

When the silicone composition of Comparative Example 1 was used, the cured coating had a thickness of more than 10 mil and a hard film formed on the surface of the liquid (silicone composition) in the dipping tank. In order to continuously dip a plurality of circuit boards in the liquid, dipping must be carried out when the liquid surface in the dipping tank was leveled. It took some time until the liquid surface was leveled. Bubbles were entrained due to liquid waving. For these reasons, the process speed must be somewhat slowed down. Additionally, since the composition of Comparative Example 1 had a high viscosity, a tailing phenomenon occurred upon withdrawal of circuit boards from the liquid, inviting contamination in a subsequent step.

Experiment 3

Using a sprayer (AIRMIX SYSTEM, manufactured by KREMLIN Inc.), each silicone composition was coated onto a circuit board surface and then cured at 23° C. and RH 65%.

The silicone compositions of Examples 1 and 2 cured into uniform silicone coatings having a thickness of 1 to 10 mil. In contrast, the silicone composition of Comparative Example 1 cured into a coating having a varying thickness of more than 10 mil.

It is to be noted that the composition of Comparative Example 2 cured into coatings which were unsatisfactory in performance because of their reduced thickness of less than 0.5 mil.

Although some preferred embodiments have been described, many modifications and variations may be made thereto in the light of the above teachings. It is therefore to be understood that within the scope of the appended claims, the invention may be practiced otherwise than as specifically described.

We claim:
1. A method of protecting a circuit board having electric and electronic chips mounted thereon from a severe ambient environment comprising coating a room temperature curable solventless silicone coating composition on the circuit board in a thickness of 1 to 5 mils, and curing the coating composition in the presence of moisture-containing air, said coating composition comprising (A) an organopolysiloxane end-blocked with a hydroxyl radical, (B) a silane of the formula (1):

$$(R^2O)_2SiR^1_{4-m} \qquad (1)$$

wherein $R^1$ is a substituted or unsubstituted monovalent hydrocarbon radical, $R^2$ is a substituted or unsubstituted monovalent hydrocarbon radical or an $\alpha,\beta$-substituted vinyl radical, and letter m is equal to 3 or 4, or a partial hydrolyzate thereof, and (C) at least one curing catalyst selected from the group consisting of an organic carboxylate of a heavy metal, a guanidyl-substituted alkoxysilane, and an organic compound having a guanidyl radical containing a siloxane, said coating composition having a viscosity of 20 to 500 centipoise at 25° C.

2. The method of claim 1 wherein the hydroxy end-blocked organopolysiloxane (A) is a mixture of one organopolysiloxane having a viscosity of at least 500 centipoise at 25° C. and another organopolysiloxane having a viscosity of up to 100 centipoise at 25° C.

3. The method of claim 1, wherein the curing catalyst is an organic titanate ester.

4. The method of claim 1, wherein the coating composition contains:

100 parts by weight of component (A), about 5 to about 30 parts by weight of component (B), and about 0.01 to about 10 parts by weight of component (C).

5. The method of claim 1, wherein the coating composition is applied by dipping, flow coating, brush coating or spraying.

6. The method of claim 1 wherein component (A) is an organopolysiloxane of the formula (2):

$$R^3_a SiO_{(4-a)/2} \qquad (2),$$

wherein $R^3$ is a substituted or unsubstituted monovalent hydrocarbon radical having 1 to 12 carbon atoms, and letter a is a positive number of 1.9 to 2.05, which is end-blocked with a hydroxyl radical.

7. The method of claim 6, wherein the organopolysiloxane has both ends end-blocked with hydroxyl groups.

8. The method of claim 6, wherein $R^3$ is an alkyl, alkenyl or aryl radical optionally substituted by halogen atoms or cyano radicals.

9. The method of claim 1, wherein, in formula (1), $R^2$ is an alkyl, alkenyl or aryl radical optionally substituted by halogen atoms or cyano radicals.

10. The method of claim 1, wherein component (B) contains at least one silane of the formula (1) wherein $R^2$ is an $\alpha,\beta$-substituted vinyl radical.

11. The method of claim 10, wherein the $\alpha$ and $\beta$ substituents are an alkyl, alkenyl or aryl radical optionally substituted by halogen atoms or cyano radicals.

12. The method of claim 1, wherein the coating composition has a viscosity of 40 to 300 cps.

13. The method of claim 1, wherein component (C) is an organic carboxylate of a heavy metal.

14. The method of claim 1, wherein the coating composition consists essentially of (A), (B) and (C).

15. The method of claim 1, wherein the coating composition is cured within 20 minutes.

* * * * *